United States Patent [19]

Nishiguchi et al.

[11] Patent Number: 5,214,308

[45] Date of Patent: May 25, 1993

[54] SUBSTRATE FOR PACKAGING A SEMICONDUCTOR DEVICE

[75] Inventors: Masanori Nishiguchi; Atsushi Miki, both of Yokohama, Japan

[73] Assignee: Sumitomo Electric Industries, Ltd., Osaka, Japan

[21] Appl. No.: 644,587

[22] Filed: Jan. 23, 1991

[30] Foreign Application Priority Data

Jan. 23, 1990 [JP] Japan .................................. 2-13412
Jan. 23, 1990 [JP] Japan .................................. 2-13413
Jan. 23, 1990 [JP] Japan .................................. 2-13417

[51] Int. Cl.⁵ ...................... H01L 23/48; H01L 21/44
[52] U.S. Cl. ................................ 257/692; 257/738; 257/773; 257/778; 257/780; 257/797; 437/183; 437/203; 437/204; 437/209; 437/212; 29/740; 29/837

[58] Field of Search ................. 357/68, 70; 437/183, 437/203, 204, 209, 212; 29/837

[56] References Cited

U.S. PATENT DOCUMENTS 4,818,728 4/1989 Rai et al. .
4,935,803 6/1990 Kalfus et al. ........................... 357/70
4,937,653 6/1990 Blonder et al. ........................ 357/68

Primary Examiner—Edward J. Wojciechowicz
Attorney, Agent, or Firm—Cushman, Darby & Cushman

[57] ABSTRACT

A substrate for packaging a semiconductor device having a bump thereon according to the present invention is characterized by that the substrate has an electrode terminal to which the bump is to be connected, and a recess for receiving at least a top of the bump is formed in the electrode terminal.

21 Claims, 5 Drawing Sheets

SUBSTRATE FOR PACKAGING A SEMICONDUCTOR DEVICE

BACKGROUND OF THE INVENTION

1. Field of the Invention

The present invention relates to a substrate for packaging a semiconductor device such as an IC chip and packaging method.

2. Related Background Art

In packaging a semiconductor device such as an IC, it has been practiced to form a convex bump on an electrode pad of the semiconductor device and directly connect the bump to an electrode terminal formed on the substrate.

In the past, the electrode terminal on the substrate has been formed flat. Thus, if the bump on the semiconductor device is not exactly positioned the material will swell out to a periphery of the electrode terminal and may shorten the adjacent electrode terminals.

Further, the higher the interaction density of the semiconductor device is, the smaller are the size and pitch of the electrode terminals formed on the substrate. As a result, as the integration density goes higher, it is necessary to more precisely position the bump to the electrode terminal.

However, such a high precision positioning requires a longer time, and the packaging time increases and a high precision and expensive positioning machine is required. As a result, the packaging cost increases.

SUMMARY OF THE INVENTION

It is an object of the present invention to shorten the time required for packaging and reduce the packaging cost.

In order to achieve the above object, in the substrate for packaging the semiconductor device of the present invention, a recess for receiving at least a top of a bump on the semiconductor device is formed in an electrode terminal on the substrate.

And in the substrate for packaging the semiconductor device of the present invention, a recess for receiving at least a top of a bump on the semiconductor device is formed on the surface of the substrate in such a manner that a depth of the recess gradually increases as it goes from a periphery to a center, and an electrode terminal to which the bump is to be connected is formed at the center of the recess.

By merely pushing the semiconductor device to the substrate after the coarse positioning, the bump on the semiconductor device can be precisely positioned to the electrode terminal on the substrate.

Further, in the method for packaging the semiconductor device of the present invention, some of bump electrodes on a semiconductor device are formed higher than the remaining bump electrodes, recesses for receiving tops of the higher bump electrodes are formed on a packaging substrate corresponding to the higher bump electrodes, inserting the tops of the higher bump electrodes into the recesses to position the semiconductor device to the packaging substrate, and the semiconductor device is packaged to the packaging substrate.

By merely lightly pushing the semiconductor device to the packaging substrate after coarse positioning to assure that the tops of the higher bump electrodes do not swell out of the recesses formed in the higher electrode terminals, the bump electrodes on the semiconductor device can be highly precisely positioned to the electrode terminals on the packaging substrate. Since the height of the higher bump electrodes which contribute to the positioning is higher than that of the remaining bump electrodes, the number of bump electrodes and the number of electrode terminals which contact to each other before the positioning is completed are reduced.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENT

The first embodiment of the present invention is now described with reference to FIGS. 1 to 3.

Figure 1A:
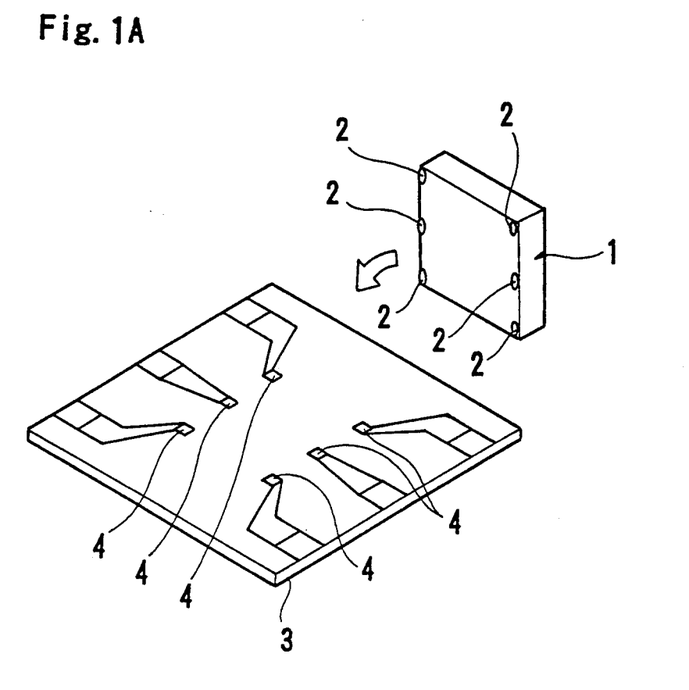
FIGS. 1A and 1B show a process for connection of a semiconductor device to a packaging substrate according to the first embodiment of the present invention.
Figure 1B:
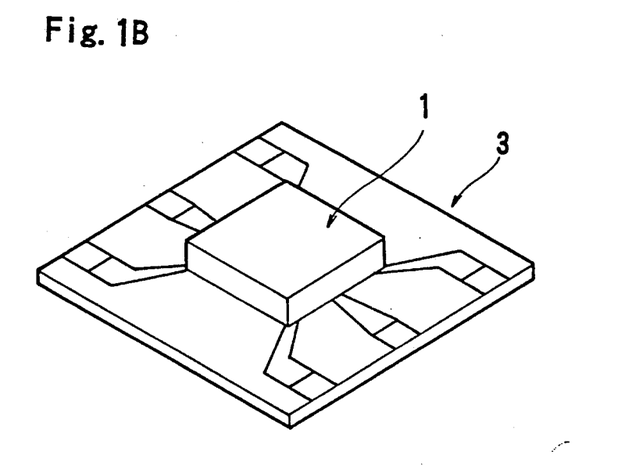
Figure 2:
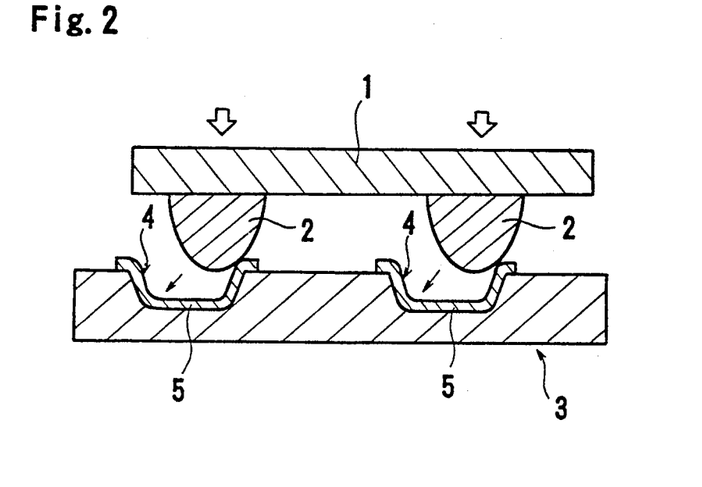
FIG. 2 shows a semiconductor device having coarsely positioned to an electrode terminal of a substrate according to the first embodiment of the present invention for packaging the semiconductor device in cross section on the perpendicular direction to the substrate surface.

As shown in FIG. 1A, a plurality of bumps 2 are formed on a semiconductor device 1 to project from the surface thereof.

On the other hand, a plurality of electrode terminals 5 corresponding to the bumps 2 on the semiconductor devices 1 are formed on the substrate 3 to which the semiconductor device 1 is to be packaged (FIG. 1A). The electrode terminal 5 may, for example, be formed in the following manner. First, a recess is formed at an area of the substrate 3 at which the electrode terminal 5 is to be formed. The recess is large enough to receive at least the top (bottom in the drawing) of the bump 2 formed on the semiconductor device 1. The recess is selectively plated to form the electrode terminal 5. The electrode terminal 5 thus formed has the recess 4 for receiving at least the top of the bump 2 on the surface thereof (See FIG. 2 and 3). It is preferable that a center of the electrode terminal 5 coincides to a deepest (lowest) position of the recess 4.

When the semiconductor device 1 is to be packaged to the substrate 3 thus formed, the bump 2 on the semiconductor device 1 is positioned to the electrode terminal 5 on the substrate by a positioning machine (not shown). This positioning may be coarse to assure that a portion of the bump 2 abuts the metal layer 5 as shown in FIG. 2.

Figure 3:
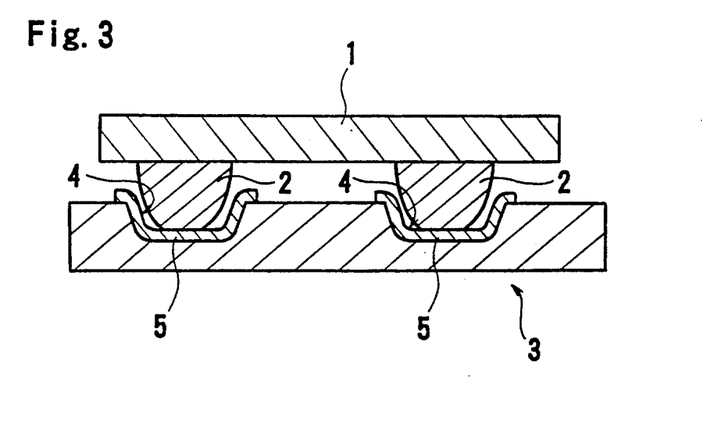
FIG. 3 shows a structure according to the first embodiment after the packaging in cross section on the perpendicular direction to the substrate surface.

Because if the top of the bump 2 is positioned within a range of the recess 4 of the electrode terminal 5, the bump 2 is guided along the surface of the recess 4 of the electrode terminal 5 as shown in FIG. 3 by lightly pushing the semiconductor device 1 to the substrate 3 after the positioning so that the bump 2 is automatically moved to the center of the electrode terminal 5 and precisely positioned to the electrode terminal 5. After such precise positioning, the substrate 3 is heated to melt the bump 2 so that the bump 2 is connected to the electrode terminal 5. When the bump 2 is molten, a surface tension of the molten bump material functions to minimize a surface area of the bump material between the electrode pad (not shown) on the semiconductor device 1 at which the bump 2 is formed and the electrode terminal 5 on the substrate 3. Accordingly, the surface tension functions to minimize the total positional error between the electrode pad on the semiconductor device 1 at which the bump 2 is formed and the electrode terminal 5 on the substrate 3 and the semiconductor device 1 is guided to a position at which the surface tensions of the respective bump materials balance. By this surface tension, more precise positioning is automatically attained. Where spare solder is provided to the electrode terminal and it is reflown, the surface tension of the molten solder functions in the same manner.

Instead of molting the bump 2, insulative bonding agent which contracts when it cures may be filled into a gap between the semiconductor device 1 and the substrate 3 and the bump 2 may be pushed to the electrode terminal 5 by a curing contraction force of the bonding agent to electrically connect the bump 2 to the electrode terminal 5.

The second embodiment of the present invention is now described with reference to FIGS. 4 and 5.

As shown in FIG. 1A, a plurality of bumps 2 are formed on a semiconductor device 1 to project from the surface thereof.

Figure 4:
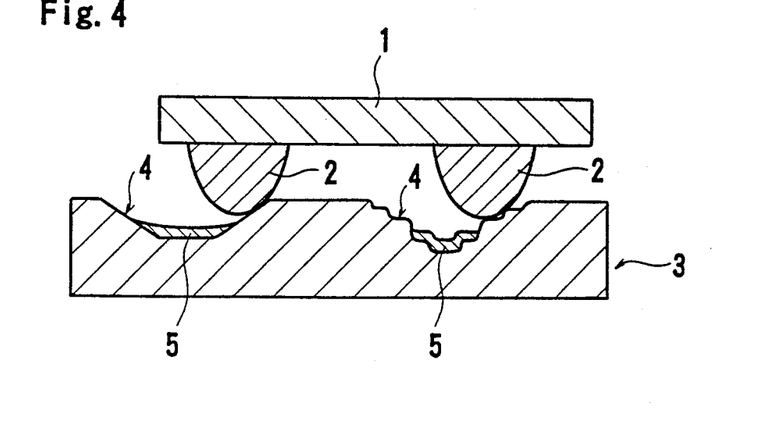
FIG. 4 shows a semiconductor device having coarsely positioned to an electrode terminal of a substrate according to the second embodiment for packaging the semiconductor device in cross section on the perpendicular direction to the substrate surface.
Figure 5:
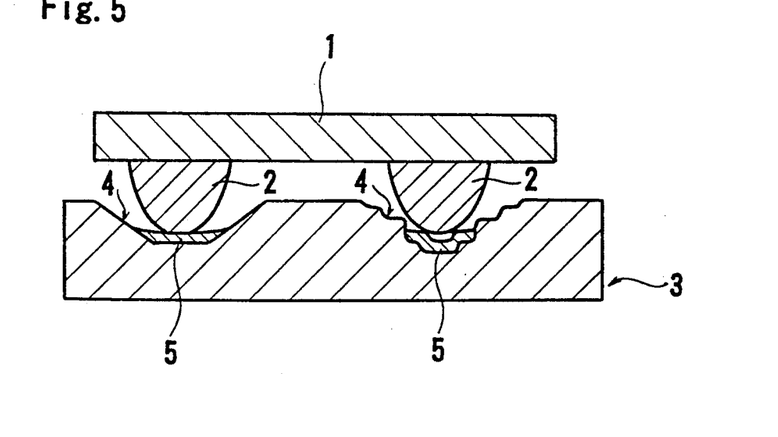
FIG. 5 shows a structure according to the second embodiment after the packaging in cross section on the perpendicular direction to the substrate surface.

On the other hand, a plurality of recesses 4 corresponding to the bumps on the semiconductor device 1 are formed on the substrate 3 on which the semiconductor device 1 is to be packaged, and the electrode terminals 5 are formed at the centers of the recesses 4 (See FIGS. 4 and 5). Each of the recesses 4 has a dimension which is large enough to receive at least a top (bottom in the drawing) of the bump 2 formed on the semiconductor device 1, and a depth of the recess gradually increases as it goes from the periphery to the center at which the electrode terminal 5 is formed. The depth of the recess 4 may gradually increase continuously from the periphery to the center. The electrode 5 may, for example, be formed by selectively plating at the center of the recess 4.

When the semiconductor device 1 is to be packaged to the substrate 3 on which the recess 4 and the electrode 5 have been formed, the bump 2 on the semiconductor device 1 is positioned to the electrode terminal on the substrate 3 by a positioning machine (not shown). This positioning may be coarse positioning which assures that the top of the bump 2 does not swell out of the recess 4 as shown in FIG. 4.

A size of the bump 2 formed on the semiconductor device 1 was 80 μm in diameter and approximately 30 μm in height. A size of the electrode terminal 5 on the substrate 3 was 100 μm in diameter. The outer diameter of the recess 4 was substantially equal to the diameter of the electrode terminal and the depth of the recess 4 was approximately 10 μm. The semiconductor device 1 was packaged on the substrate 3. In this case, positioning precision required for a positioning machine, in order to maintain a positioned error between the bump 2 and the electrode terminal 5 after the packaging within ±10 μm, was ±50 μm.

On the other hand, the same semiconductor device as that of the above example was packaged on a prior art substrate having a flat electrode terminal of the same dimension as that of the above example. The precision required for the positioning machine was +/−10 μm. The result is shown below.

|  | Present invention | Prior art |
| --- | --- | --- |
| Precision of positioning machine | ±50 μm | ±10 μm |
| Positional error after packaging | ±10 μm | ±10 μm |

Figure 6:
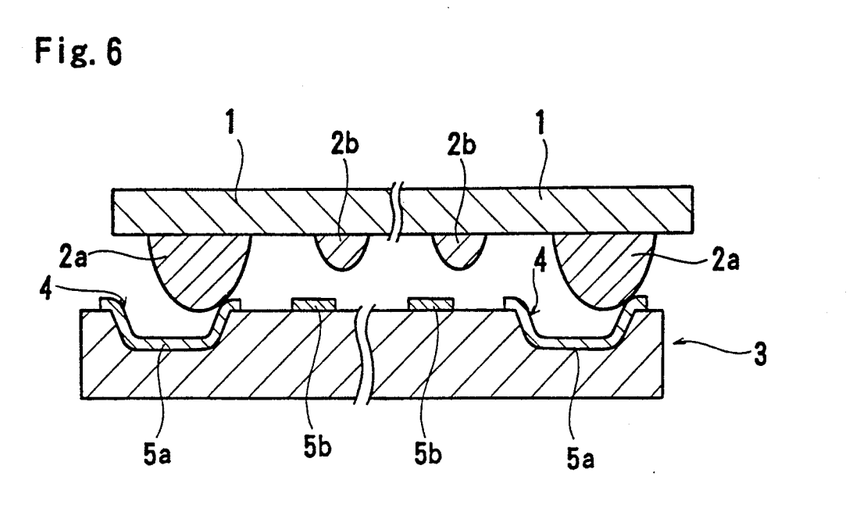
FIG. 6 shows a semiconductor device having coarsely positioned to electrode terminals of a substrate according to the third embodiment for packaging the semiconductor device in cross section on the perpendicular direction to the substrate surface.

The third embodiment of the present invention is now described with reference to FIGS. 6 to 8.

As shown in FIG. 1A, a plurality of bump electrodes are formed on a semiconductor device 1 to project therefrom. A height of some bump electrode 2a is higher than that of the remaining bump electrode 2b so that the bump electrode 2a projects more largely from the surface of the semiconductor device 1 than the remaining bump electrode 2b.

On the other hand, a plurality of electrode terminals 5a and 5b are formed on a packaging substrate 3 on which the semiconductor device 1 is packaged, corresponding to the bump electrodes 2a and 2b on the semiconductor device 1. A recess 4 for receiving at least a top of the bump electrode 2a is formed on a surface of the electrode terminal 5a which corresponds to the bump electrode 2a (See FIGS. 6 and 7). A depth of the recess 4 gradually increases as it goes from a periphery to a center and it is deepest at the center.

The electrode terminal 5a having such recess 4 may, for example, be formed in the following manner. First, a recess is formed at an area of the packaging substrate 3 at which the electrode terminal 5a is to be formed. The recess is large enough to receive at least a top (bottom in the drawing) of the bump 2 formed on the semiconductor device 1. The recess is selectively metal-plated or vacuum-deposited to form the electrode terminal 5a. The electrode terminal 5a thus formed has the recess 4 for receiving at least the top of the bump electrode 2a, formed there on.

When the semiconductor device 1 is to be packaged to the substrate 3 thus formed, the bump 2 on the semiconductor device 1 is positioned to the electrode terminal 5 on the substrate by a positioning machine (not shown). This positioning may be coarse to assure that a portion of the bump 2 abuts the metal layer 5a as shown in FIG. 6. Because if the top of the bump 2 is positioned within a range of the recess 4 of the electrode terminal 5, the bump 2 is guided along the surface of the recess 4 of the electrode terminal 5 by lightly pushing the semiconductor device 1 to the substrate 3 after the positioning and it is automatically moved toward the center of the recess 4.

Figure 7:
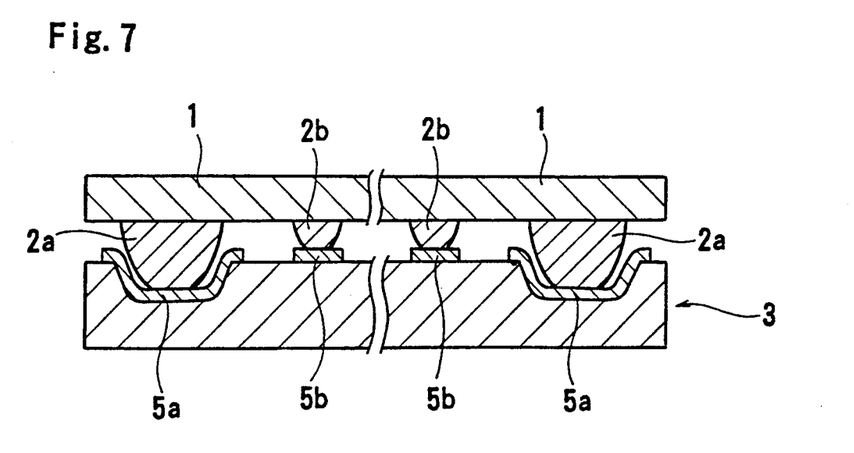
FIG. 7 shows a structure according to the third embodiment after the packaging in cross section on the perpendicular direction to the substrate surface.

As shown in FIG. 7, the bump electrode 2a is positioned to the center of the electrode terminal 5a and the other bump electrode 2b abuts against the corresponding electrode terminal 5a. And the first abutted bump electrode 2a slides on the packaging substrate 3 while it contacts thereto. Accordingly, the bump electrode 2a contacts to the wiring pattern formed on the packaging substrate 3 including the electrode terminals 5a and 5b, and the wiring pattern is damaged by the contact. In order to reduce the damage which the wiring pattern suffers from the contact to the bump electrode, in accordance with the present invention, some bump electrode 2a projects further from the surface of the semiconductor device 1 than the other bump electrode 2b. Thus, compared to a case where all bump electrode are formed with the some height, the number of bump electrodes which contact to the wiring pattern before the positioning is completed can be reduced, and the damage which the bump electrode and the wiring pattern suffer from the contact can be reduced. Accordingly, a total reliability of the bump electrodes 2a and 2b and the electrode terminals 5a and 5b is improved and a yield of packaging is improved.

Figure 8:
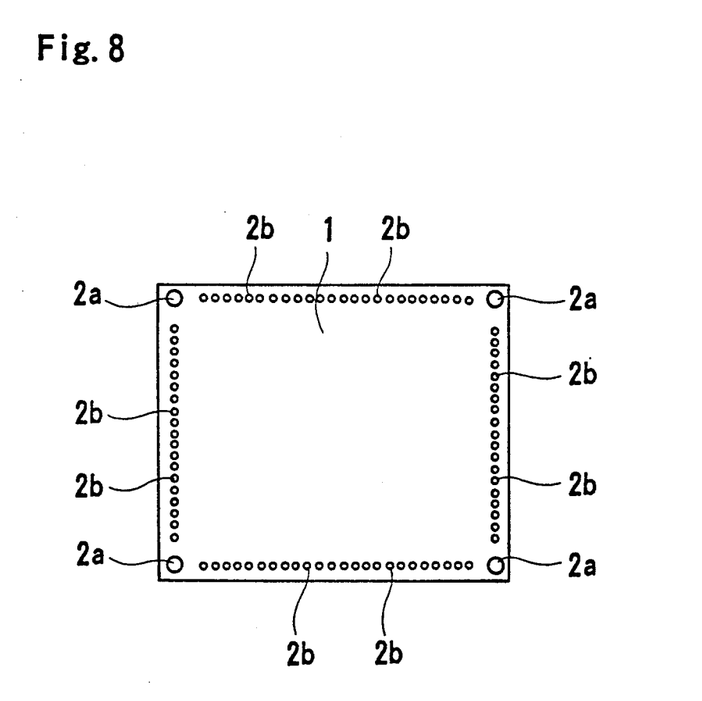
FIG. 8 shows an arrangement of bump electrodes in the semiconductor device which can be applied for any of above embodiments.

Further, by selecting the bump electrode 2a which is formed higher than the other bump electrode 2b from a low bump electrode density area such as a corner of the semiconductor device 1 as shown in FIG. 8, a frequency of contact of the bump electrode 2a to the wiring pattern formed on the packaging substrate 3 can be further reduced.

In the present invention, the recess 4 for receiving the top of the bump electrode 2a is formed only in the electrode terminal 5a formed on the packaging substrate 3 correspondingly to the bump electrode 2a. By forming the recess 4 only in the limited electrode terminals, the number of electrode terminals having the recesses formed therein can be reduced.

Since the number of electrode terminals 5a which are formed in the recesses of the packaging substrate 3 is limited as described above, a possible area of break of the wiring pattern is reduced.

Further, by forming the bump electrode 2a and the electrode terminal 5a which contribute to the positioning as a bump electrode and an electrode terminal for exclusively positioning use which are not connected to the electronic circuit formed on the semiconductor device 3, the other bump electrode 2b and electrode terminal 5b which are connected to the electronic circuit of the semiconductor device and contribute to the exchange of electrical signals with the electronic circuit do not contact to each other until the positioning is completed and the damage due to the contact is prevented. Further, since it is not necessary to form the recesses in the electrode terminal which are connected to the electronic circuit of the semiconductor device, a possible area of break due to the formation of steps disappears from the exchange of the electrical signals with the electronic circuit.

After the positioning of the semiconductor device 1 to the packaging substrate 3, the packaging substrate 3 is heated, spare solder (not shown) applied to the electrode terminals 5a and 5b is reflown and the bump electrodes 2a and 2b and the corresponding electrode terminals 5a and 5b are interconnected. In this case, a surface tension of the reflown spare solder acts to gaps between the bump electrodes 2a and 2b and the electrode terminals 5a and 5b and more precise positioning is automatically attained by the action of the surface tension. Even if the spare solder is not applied, a same effect may be attained by melting the bump electrodes 2a and 2b by heating them.

In the present embodiment, the recess 4 for receiving the top of the bump electrode 2a is formed in the electrode terminal 5a on the packaging substrate. Alternatively, a recess for receiving the top of the bump electrode 2a may be formed on the surface of the packaging substrate 3 and an electrode terminal which is formed correspondingly to the bump electrode 2a may be arranged at the center of the recess to attain similar operation and effect.

In accordance with the present invention, a high precision and expensive positioning machine used in the prior art is not required and a relatively inexpensive positioning machine can be used. Further, since the positioning by the positioning machine may be coarse, the positioning time required for the positioning by the positioning machine is shorter than that in the prior art which required the precise positioning by the positioning machine. Accordingly, the time and cost for the packaging can be reduced.

Further, since the damage of the electrode terminals and the bump electrodes which are formed on the packaging substrate and connected to the electronic circuit of the semiconductor device is reduced, the reliability of the electrode terminal and the bump electrodes is improved and the semiconductor device can be packaged on the packaging substrate with high reliability and high yield.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A substrate for packaging a semiconductor device, the semiconductor device having at least one electrode bump projecting therefrom, said substrate comprising:
   an electrode terminal for connecting said bump thereto, and
   at least one recess formed on a surface of said electrode terminal for receiving at least a top portion of said bump,
   said bump being round-shaped so as to be in sliding contact with a portion of said recess during initial assembly of said semiconductor device to said substrate after coarse positioning of said semiconductor device with said substrate, the bump and the recess being configured such that exertion of a light force on said bump moves said bump along said portion of said recess so that said bump automatically engages a center portion of said recess so as to precisely position said bump within said recess and thereby align said semiconductor device with said substrate upon final packaging.

2. A substrate for packaging a semiconductor device according to claim 1 wherein said recess has a depth increasing from a periphery to a center.

3. A substrate for packaging a semiconductor device according to claim 2 wherein said depth of said recess gradually increases stepwise.

4. A substrate for packaging a semiconductor device according to claim 2 wherein said depth of said recess gradually increases continuously.

5. A substrate for packaging a semiconductor device according to claim 1 wherein a top of said bump is of substantially spherical shape and said recess has a larger radius of curvature than that of said top.

6. A substrate for packaging a semiconductor device, the semiconductor device having at least one electrode bump projecting therefrom, said substrate comprising:
a recess formed on a surface thereof for receiving at least a top portion of said bump, an electrode terminal being formed at a center of said recess to which said bump is being connected,
said bump being round-shaped so as to be in sliding contact with a portion of said recess during initial assembly of said semiconductor device to said substrate after coarse positioning of said semiconductor device with said substrate, the bumps and recess being configured such that exertion of a light force on said bump moves said bump along said portion of said recess so that said bump automatically engages a center portion of said recess so as to precisely position said bump within said recess and thereby align said semiconductor device with said substrate upon final packaging.

7. A substrate for packaging a semiconductor device according to claim 6 wherein said electrode terminal is formed by selective plating.

8. An electronic packaging structure comprising:
a semiconductor device having at least one electrode bump projecting therefrom,
a packaging substrate having a recess formed on a surface thereof for receiving at least a top portion of said bump, said recess including an electrode terminal formed at the center of said recess for connecting said bump thereto,
said bump being round-shaped so as to be in sliding contact with a portion of said recess during initial assembly of said semiconductor device to said substrate after coarse positioning of said semiconductor device with said substrate, the bump and recess being configured such that exertion of a light force on said bump moves said bump along said portion of said recess so that said bump automatically engages a center portion of said recess so as to precisely position said bump within said recess thereby aligning said semiconductor device with said substrate upon final packaging.

9. An electronic packaging structure according to claim 8 wherein said electrode terminal is formed by selective plating.

10. An electronic packaging structure according to claim 8 wherein said recess has a depth increasing from a periphery to a center.

11. An electronic packaging structure according to claim 10 wherein said depth of said recess gradually increases stepwise.

12. An electronic packaging structure according to claim 10 wherein said depth of said recess gradually increases continuously.

13. An electronic packaging structure comprising:
a semiconductor device having a plurality of round-shaped electrode bumps formed thereon and projecting therefrom, some of said bumps extending further from said semiconductor than other bumps, and
a packaging substrate including electrode terminals, said electrode terminals having recesses formed to receive at least a top portion of said further extending bumps,
said further extending bumps being in sliding contact with a portion of said recesses during initial assembly of said semiconductor device to said substrate after coarse positioning of said semiconductor device with said substrate, the bumps and the recesses being configured such that exertion of a light force on said bumps moves said bumps along said portion of said recesses so that said bumps automatically engage center portions of said recesses so as to precisely position said further extending bumps within said recesses thereby aligning said semiconductor device with said substrate upon final packaging.

14. An electronic packaging structure according to claim 3 wherein said recesses have a depth which increases from a periphery to a center.

15. An electronic packaging structure according to claim 14 wherein said depth of said recesses gradually increases stepwise.

16. An electronic packaging structure according to claim 14 said depth of said recess gradually increases continuously.

17. A method for packaging a semiconductor device on a packaging substrate, said semiconductor device having a plurality of round-shaped electrode bumps projecting therefrom, said packaging substrate including a plurality of electrode terminals on a surface thereof, said terminals having recesses, said method comprising the steps of:
forming certain bumps so as to extend further from said semiconductor than other bumps;
forming said recesses in particular electrode terminals so as to correspond to and receive said further extending bumps;
inserting a portion of said further extending bumps into said recesses so as to be in sliding contact with portions of said recesses;
pushing said semiconductor device to said substrate so that said further extending bumps move along said portions of said recesses so as to position said further extending bumps with center portions of said recesses thereby positioning said semiconductor device with respect to said packaging substrate;
packaging said semiconductor device to said packaging substrate.

18. A method for packaging a semiconductor device according to claim 17 wherein said further extending bumps are arranged on a low density area of said semiconductor device.

19. A method for packaging a semiconductor device according to claim 17 wherein said further extending bumps and said particular electrode terminals are used exclusively for positioning.

20. A method for packaging a semiconductor device on a packaging substrate, said semiconductor device having a plurality of round-shaped electrode bumps projecting therefrom, said packaging substrate including a plurality of recesses formed therein, said recesses having an electrode terminals, said method comprising the steps of:

forming certain bumps so as to extend further from said semiconductor than other bumps;

forming said electrode terminals at the center of said recesses so as to correspond to and receive said further extending bumps;

inserting a portion of said further extending bumps into said electrode terminals so as to be in sliding contact with portions of said electrode terminals;

pushing said semiconductor device to said substrate so that said further extending bumps move along said portions of said electrode terminals so as position said further extending bumps with center portions of said electrode terminals to position said semiconductor device with regard to said packaging substrate;

packaging said semiconductor device to said packaging substrate.

21. An electronic packaging structure comprising:

a packaging substrate having at least one electrode bump projecting therefrom, a semiconductor device having a recess formed on a surface thereof for receiving at least a top portion of said bump, said recess including a an electrode terminal formed at the center of said recess for connecting said bump thereto, said bump being round-shaped so as to be in sliding contact with a portion of said recess during initial assembly of said semiconductor device to said substrate after coarse positioning of said semiconductor device with said substrate, the bump and the recess being configured such that exertion of a light force on said bump moves said bump along said portion of said recess so that said bump automatically engages a center portion said recess so as to precisely position said bump within said recess thereby aligning said semiconductor device with said substrate upon final packaging.

* * * * *